(12) United States Patent
Wang et al.

(10) Patent No.: US 9,025,693 B2
(45) Date of Patent: May 5, 2015

(54) ON-CHIP INTERFERERS FOR STANDARDS COMPLIANT JITTER TOLERANCE TESTING

(75) Inventors: John Wang, Sunnyvale, CA (US); Vasudevan Parthasarathy, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 323 days.

(21) Appl. No.: 13/538,871

(22) Filed: Jun. 29, 2012

(65) Prior Publication Data

US 2013/0301691 A1    Nov. 14, 2013

Related U.S. Application Data

(60) Provisional application No. 61/646,527, filed on May 14, 2012.

(51) Int. Cl.
   *H04B 17/00*    (2006.01)
(52) U.S. Cl.
   CPC ............ *H04B 17/14* (2013.01); *H04B 17/0012* (2013.01)

(58) Field of Classification Search
   CPC .................................................... H04B 17/0012
   USPC ......................................... 375/285, 221, 226
   See application file for complete search history.

(56) References Cited

U.S. PATENT DOCUMENTS

| 2005/0044463 A1* | 2/2005 | Frisch ........................... 714/738 |
| 2007/0002989 A1* | 1/2007 | Song ............................. 375/355 |
| 2010/0232558 A1* | 9/2010 | Terada et al. .................. 375/374 |

* cited by examiner

*Primary Examiner* — Michael Neff
(74) *Attorney, Agent, or Firm* — Sterne, Kessler, Goldstein & Fox P.L.L.C.

(57) ABSTRACT

Systems and methods that facilitate on-chip testing are provided. An integrated circuit can include a transmitter configured to transmit a communications signal via a communications channel. The integrated circuit can also include a receiver configured to receive the communications signal via the communications channel. A jitter creation module also can form part of the integrated circuit and can introduce jitter into the system thereby allowing for on-chip jitter testing. The jitter creation module can form either part of the transmitter or receiver and can introduce the jitter by phase interpolation.

20 Claims, 8 Drawing Sheets

ON-CHIP INTERFERERS FOR STANDARDS COMPLIANT JITTER TOLERANCE TESTING

CROSS-REFERENCE TO RELATED APPLICATIONS

This application claims priority to U.S. Provisional Patent Application No. 61/646,527, filed on May 14, 2012, the contents of which is incorporated herein by reference in its entirety.

FIELD OF THE INVENTION

The invention relates to systems and methods for on-chip testing of jitter tolerance in communications circuitry.

BACKGROUND

In communications systems, the term "jitter" refers to a deviation from the expected value of a periodic signal over time. Since some jitter is inevitable, there is a need for modern communications systems to exhibit some tolerance to jitter, and still meet performance requirements. Indeed many industry standards require communications systems to have a minimum tolerance for jitter, which is measured according to various metrics. Manufacturers, researchers, engineers, and end users, therefore, are very concerned with testing the jitter tolerance of communications components and systems.

Traditionally, jitter tolerance has been tested using external test equipment to introduce various types of jitter to the system-under-test. Using the traditional external test equipment, jitter (also called interferers herein) is introduced into the system and the system's tolerance is determined by analyzing the output of the system.

There are multiple problems with external test equipment. First, external test equipment for jitter is very expensive. For example, test equipment for systems with high transmission rates (e.g., 40 gigabits per second) can cost upwards of half a million dollars. Second, tests performed using external equipment are time consuming. Third, a single piece of test equipment cannot be in two places at once, thereby limiting the availability of jitter testing.

BRIEF SUMMARY

According to one aspect of the disclosure, an integrated circuit for communication includes a transmitter, a receiver, and a jitter creation module. The transmitter is configured to transmit a communications signal via a communications channel. The receiver is configured to receive a communications signal via the communications channel. The jitter creation module is configured to introduce jitter into the circuit based on a jitter input signal. According to another aspect, the jitter creation module can form part of the transmitter or receiver structures of the integrated circuit, or both. Additionally, the integrated circuit may operate in test and normal modes. In normal mode, the jitter creation module can be selectively powered off of to reduce the power consumption of the chip. In test control mode, however, the jitter creation module may be selectively powered on so that it can introduce jitter into the integrated circuit to test jitter tolerance.

According to a further aspect of the disclosure, a method of on-chip jitter tolerance testing in an integrated communication circuit is provided. According to the method, a jitter input signal is received by the integrated circuit. Jitter is generated in the circuit based on the received jitter input signal, where the type and severity of jitter may be defined by the jitter input signal. The jitter is generated by a jitter creation module that forms part of the integrated circuit. According to one aspect, the jitter creation module forms part of the transmitter and is, therefore, introduced at the transmitter. According to another aspect, the jitter creation module forms part of the receiver and the jitter is, therefore, introduced at the receiver.

BRIEF DESCRIPTION OF THE DRAWINGS/FIGURES

Embodiments of the disclosure are described with reference to the accompanying drawings. In the drawings, like reference number indicate identical or functionally similar items. Additionally, the left-most digit(s) of a reference number indicates the drawing in which the reference number first appears.

DETAILED DESCRIPTION

The following detailed description refers to accompanying drawings to illustrate exemplary embodiments consistent with the disclosure. References in the detailed description to "one exemplary embodiment," "an exemplary embodiment," "an example exemplary embodiment," etc., indicate that the exemplary embodiment described may include a particular feature, structure, or characteristic, but every exemplary embodiment may not necessarily include the particular feature, structure, or characteristic. Moreover, such phrases are not necessarily referring to the same exemplary embodiment. Further, when a particular feature, structure, or characteristic is described in connection with an exemplary embodiment, it is within the knowledge of those skilled in the relevant art to affect such a feature, structure, or characteristic in connection with other exemplary embodiments whether or not explicitly described.

The exemplary embodiments described herein are provided for illustrative purposes, and are not limiting. Other exemplary embodiments are possible and modifications may be made to the exemplary embodiments within the spirit and scope of the disclosure. Further, the detailed description is not meant to limit the invention, as the scope of the invention is defined only in accordance with the following claims and their equivalents.

Embodiments of the disclosure may be implemented in hardware, firmware, software, or any combination thereof. Embodiments of the disclosure may also be implemented as instructions stored on a computer-readable medium which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices, and others. Further, firmware, software, routines, and instructions may be described herein as performing certain actions. However, it should be appreciated that such descriptions are merely for convenience and that such actions in fact result from competing devices, processors, controllers or other devices executing the firmware, software, routines, instructions, etc.

The following detailed description of the exemplary embodiments will so fully reveal the general nature of the disclosure that others can, by applying knowledge of those skilled in the relevant arts readily modify and/or adapt for various applications such exemplary embodiments, without undue experimentation, without departing from the spirit and scope of the disclosure. Therefore, such adaptations and modifications are intended to be within the meaning and plurality of equivalents of the exemplary embodiments based upon the teaching and guidance presented herein. It is to be understood that the phraseology or terminology herein is for the purpose of description and not of limitation, such that the terminology or phraseology of the present specification is to be interpreted by those skilled in the relevant arts in light of the teachings herein.

Figure 1:
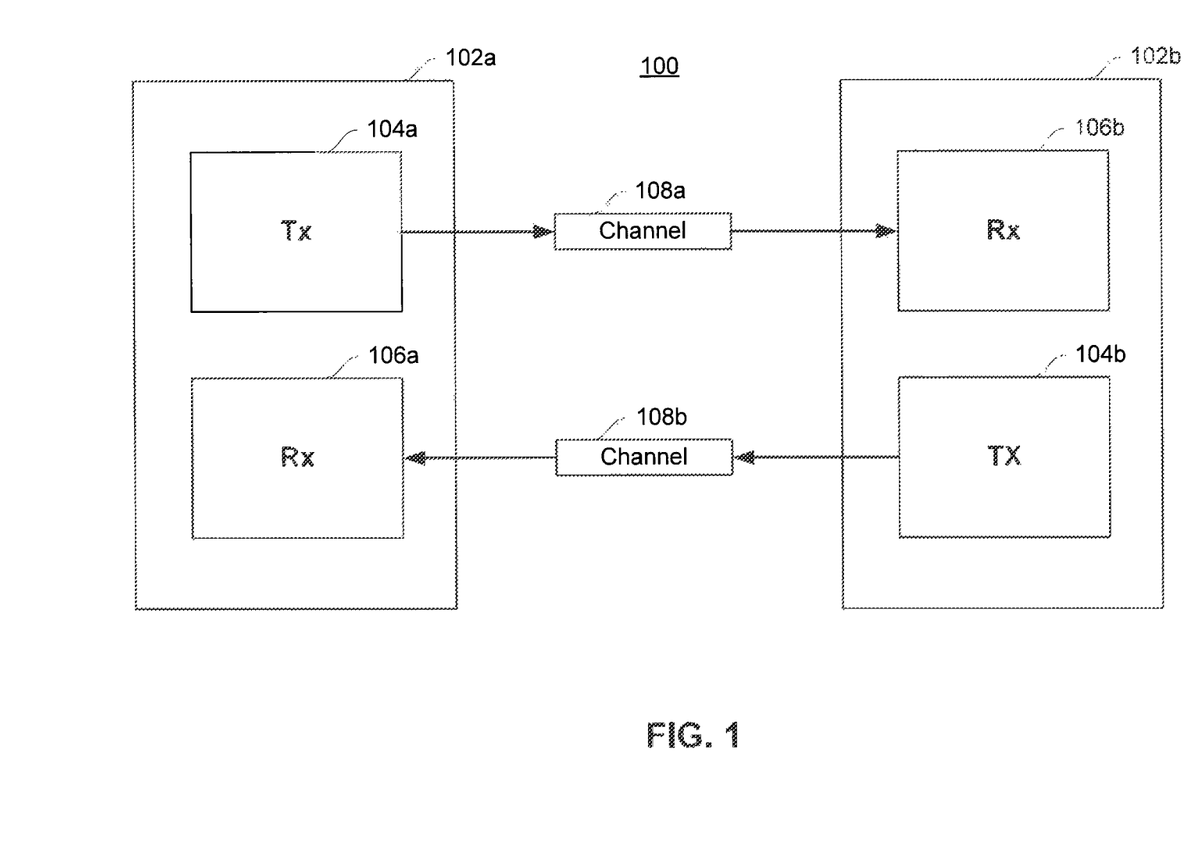
FIG. 1 is a block diagram of communications system according to embodiments of the disclosure.

FIG. 1 illustrates an exemplary communications system according to embodiments of the present disclosure. As shown, the communications system 100 can include one or more communication components 102a and 102b. Communication components 102a and 102b are connected to each other via communications channels 108a and 108b (generically referred to herein as communications channel 108). Each communication component 102a and 102b includes respective transmitter sub-components 104a and 104b, and respective receiver sub-component 106a and 106b. While communication components 102a and 102b comprise both transmission and reception sub-components, it is also contemplated that each communications component 102a and 102b could be dedicated to a particular function. For instance, according to embodiments of the disclosure, communication component 102a could include only a transmitter 104a and communication component 102b could include only a receiver 106b.

According to some embodiments, each of the communication components 102a and 102b could be implemented using a single integrated circuit such as an ASIC, formed on a semiconductor substrate. However, according to other embodiments of the present invention, the transmitter sub-components 104a and 104b and the receiver sub-components 106a and 106b may be implemented with separate integrated circuits. Additionally, the communications channel 108 can comprise any suitable transmission medium including, for instance, cable, optical, wireless, twisted pair, Ethernet, to name a few.

In a normal communications mode, the transmitter 104a of component 102a transmits a communications signal to communications channel 108a, and the receiver 106b associated with component 102b can then receive the communication signal from the channel 108a. To communicate in the opposite direction, a similar method employing channel 108b can be used. It is noted that the separate channels are shown operating half-duplex for ease of illustration. However, one skilled in the art would recognize that full duplex (two-way communication) over a single physical channel could be implemented, and is within the scope and spirit of the present disclosure.

Figure 2:
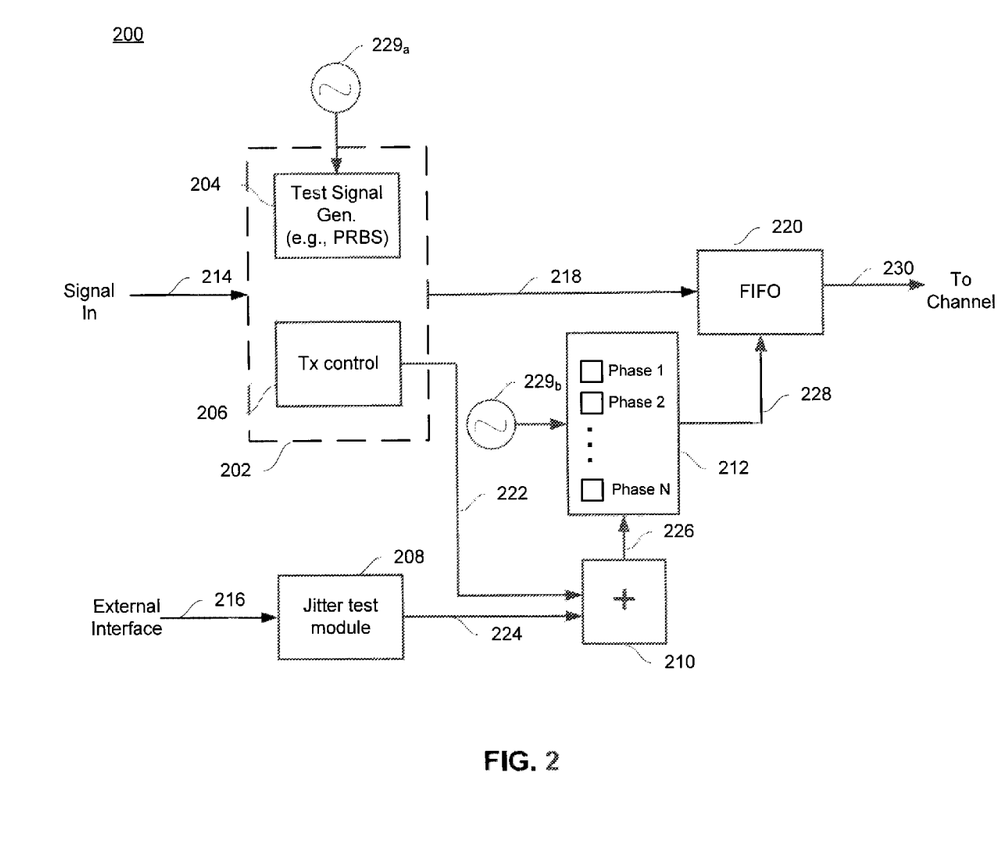
FIG. 2 is a block diagram of a transmitter component of a communications system according to embodiments of the disclosure.

FIG. 2 is a functional block diagram that depicts an exemplary transmitter 200 according to embodiments of the present disclosure. The transmitter 200 can include a signal processing module 202, a jitter test module 208, a combiner 210, a phase adjuster 212, and an output queue 220. The signal processing module 202 can include a test signal generator 204 and a transmission control 206. In normal communications mode, the transmitter 200 receives an input signal 214, generates a communications signal 230 using its various components and outputs the communications signal 230 to channel 108. During test mode, transmitter 200 is also capable and configured to introduce jitter in the signal 230 that it transmits to the channel 108. Further, the various embodiments described herein can be performed independent of the channel, the line-code (or modulation scheme) and for a variety of wired or wireless chip-sets. Still further, the various on-chip techniques used in this patent can be incorporated as a part of production tests, standards compliance tests, margin evaluation, and debug.

In normal communication mode, the signal processing module 202 generates an appropriate communications signal 218 based on the input signal 214. For instance, the signal processing module 202 can receive an input signal, perform some signal processing on the signal (e.g., forward error correction, modulation, etc.), and generate an output signal 218. Signal 218 is then output to a queue, such as FIFO 220, for transmission to the channel 108. The signal processing module 202 can also produce a transmission control signal 222, which can be used as a control input 226 to phase adjuster 212, via combiner 210. More specifically, during normal communications mode, jitter test module 208 is off, and therefore, the output of combiner 210 is the transmission control signal 222. During normal communications with loop-back mode, the transmit control 206 recovers a receive clock from the input signal 214, and controls the phase rotation of the phase adjuster 212, so that the FIFO 220 is clocked based on a recovered receive clock. This insures that the output signal 230 will have an appropriate phase alignment with the receive clock that is recovered from the input signal 214. During a test mode, the signal processing module does not receive an input signal 214, and therefore, may generate a test pattern using test signal generator 204. One or more known test patterns can be used to test the performance of a communications link by measuring various performance metrics (e.g. bit error rate [BER], signal-to-noise ratio [SNR], etc.)

The FIFO 220 operates as an output queue and is designed to receive a signal (e.g., bits from signal processing module 202) and output the signal to channel 230 at regular intervals as dictated by its input clock (or timing) 228 received at its timing input. By way of example, assume that FIFO 220 outputs a first signal bit at time $t_0=T_0$. It will then output the next bit at time $t_1=T_0+T$, where T is the period of the input clock 228. Similarly, the third bit will be output at time $t_2=T_0+2T$, and so on. The phase of the output signal 230, however, can be dynamically adjusted by altering the phase of the input clock signal 228, which is the role played by the phase adjuster 212.

According to some embodiments, the phase adjuster 212 may comprise a phase interpolator. In general, phase interpolators generate an output signal with a different phase from the input signal, where the phase shift is determined by a control input. For instance, in embodiments where the phase adjuster 212 is a phase interpolator, phase adjuster 212 receives clock or oscillator $229_b$ input, and generates a phase shifted version of the clock $229_b$ that provides the input clock 228 for the FIFO 220. The amount of phase shift performed by a phase interpolator is determined by the input control signal, which is the combined signal 226. During normal communications operation, for instance, the phase interpolator could make no adjustment to the clock signal from clock $229_b$. In this case, the signal 218 (which may be a modulated data signal) is clocked out of the FIFO 220 at the constant rate of the clock $229_b$. However, when the transmission circuit 200 is operating in a test mode or a loop-back mode, the phase interpolator 212 can dynamically alter the signal from clock $229_b$ as determined by the combined signal 226. The clock signal can be altered to either increase or decrease the period during one or more cycles of the clock $229_b$, which will effectively change the phase of the input clock 228 of the FIFO 220, and thereby the phase of the output signal 230.

By way of example, assume again that the FIFO 220 outputs a first signal bit again at time $t_0=T_0$. To introduce a phase change in the output signal, the phase adjuster 212 can alter the clock input 228 of the FIFO so that the period is not constant. Accordingly, the second bit might be output at time $t_1=T_0+T\pm\Delta T_1$ where T is the period of clock $229_b$ and $\Delta T_1$ is the amount the phase adjustor has either increased or decreased the period based on combined signal 226 during that cycle. Continuing with the same example, the third bit could be sent at time $t_2=t_1+T\pm\Delta T_2$, where $\Delta T_2$ is the amount that the phase adjustor has altered the period of the clock $229_b$ during that cycle, which may or may not be the same as the amount the phase adjuster 212 has previously altered the period.

While the phase adjuster 212 has been described by way of example as a phase interpolator, the phase adjuster may comprise any number of different circuits. For instance, for analog implementations, the phase adjuster 212 could be embodied as a voltage controlled oscillator (VCO). Additionally, the phase adjuster 212 could be implemented as a N-to-1 phase multiplexer that receives a set of N input clocks that are each delayed by a particular amount. Based on the control signal fed into the multiplexer, the appropriate output clock can be picked.

The jitter test module 208 receives an input jitter control 216 via an external interface and produces a jitter control signal 224. Module 210 can receive and combine the transmission control signal 222 with the jitter control signal 224 to produce a combined signal 226. The combined signal 226 is then used to control the phase adjuster 212, which in turn produces an input clock signal 228 for FIFO 220.

According to various embodiments, clocks $229_a$ and $229_b$ may comprise any suitable clock circuit such as a phase lock loop (PLL) having a voltage controlled oscillator (VCO) to produce a variable frequency clock signal. Additionally, clocks $229_a$ and $229_b$ may be the same clock according to some embodiments, or may be separate clocks.

As noted above, the transmission circuit 200 can operate in at least three modes: a normal communications mode, a loop-back mode, and a test mode. In normal mode, the transmission circuit receives an input (data) signal 214 at the processing module 202, and outputs signal 218 to the FIFO 220, which outputs signal 230 to channel 108. Each cycle of the output signal 230 is dictated by its clock input 228. In normal communications mode, the phase adjuster 212 can keep the phase of the signal from clock $229_b$ constant, and therefore simply pass the clock $229_b$ to the clock input 228 of the FIFO 220. For instance, the transmission control 206 may send a control signal to the phase adjuster 212 causing it to simply pass the clock signal from clock $229_b$ without making any phase adjustments. Alternatively, the transmission control 206 may generate a control signal 222 that causes phase adjuster 212 to implement a constant phase shift to the clock $229_b$, which is then used for FIFO control.

When operating in a loop-back mode, the transmission circuit 200 can also receive an input (data) signal 214 at signal processing module 202. The signal processing module can, again, perform signal processing on the received signal and output signal 218 to FIFO 220, which, in turn, outputs signal 230 to channel 108 at regular intervals as dictated by clock input 228. In loop-back mode, however, the phase adjuster 212 can dynamically change the phase of signal from clock $229_b$ to, for instance, match the phase of another signal (not shown). For example, the input signal 214 can have an associated receive clock that is recovered by transmit control module 206, and the phase adjuster 212 can be controlled via input 226 so that its output is frequency and or phase-aligned with the receive clock, and thereby the output signal 230 can also be frequency and/or phase-aligned with the receive clock. To do so, the transmission control 206 recovers the receive clock from the input signal 214 and outputs a control signal 222, which causes the phase adjuster 212 to alter the phase of the clock $229_b$ to produce the desired frequency and or phase alignment of the FIFO control 228.

In a test mode, the signal processor 202 can generate a test signal using test signal generator 204 and clock $229_a$. The test signal generator 204 can produce a test signal (or pattern) according to any of a number of known test patterns, including for example, a pseudo-random binary sequence (PRBS) test pattern. The output of the generator 204 can then be sent to FIFO 220 to be output to channel 108 based on the clock signal input 228 from the phase adjuster 212. The test signal is known a priori, and therefore system performance can be measured at the receiver by comparing the received bit pattern with the known transmitted bit pattern. After which, metrics can be calculated using for example, bit error rates (BER), or signal-to-noise ratio (SNR). According to some embodiments, the metrics can also be calculated in non-test modes as well.

When transmission circuit 200 operates in test mode, the jitter test module 208 can receive an input jitter control 216 from an external interface that defines the type and severity of jitter that is to be added to the output signal 230. The jitter test module 208 then produces a jitter control signal 224 to control phase adjuster 212 to appropriately phase shift the clock input 228 so as to produce the desired jitter in the output signal 230. The jitter control signal 224 may or may not be combined with control signal 222 by module 210 according to various embodiments. In embodiments, transmission control 206 does not produce a control signal 222 when transmitter 200 operates in test mode, and therefore only the jitter control signal 224 controls the phase adjuster input 226. In other embodiments, the test control signal 224 is combined with transmission control signal 222 in a loop back mode, or some other mode.

Combiner 210 produces signal 226, which may be either a combination of control signals 222 and 224 (if the transmission control 206 produces a signal during test mode), or just jitter control signal 224 (if transmission control 206 does not produce a signal during test mode), which acts as the control input to phase adjuster 212. As discussed above, the phase adjuster 212 adjusts the phase of the clock input $229_b$ based on the input control 226 to produce clock input 228 that clocks the FIFO 220. By dynamically changing the phase of the clock signal 228 according the jitter control signal 224, the phase adjuster 212 can produce, for example: sinusoidal jitter, random jitter, deterministic jitter, time varying jitter, and/or a frequency offset (including time varying frequency offset) in the output signal 230 as defined by the input jitter control 216. Further, the intensity or severity of the jitter can be defined and varied, so as to incrementally determine the system jitter tolerance. Further, one or more of types of jitter can be combined, and introduced simultaneously.

As noted above, the transmitter 200 can operate in normal, loop-back, and test modes. During operations in the various modes, it is possible for the transmitter to selectively power various components on and off. For instance, during normal and loop-back operation, the transmitter 200 may power off the jitter control module 208 in order to conserve power. During test mode, however, the transmitter 200 may power on the jitter control module 208. According to some embodiments, the transmission control 206 may be powered off during test mode if it is not required.

Figure 3:
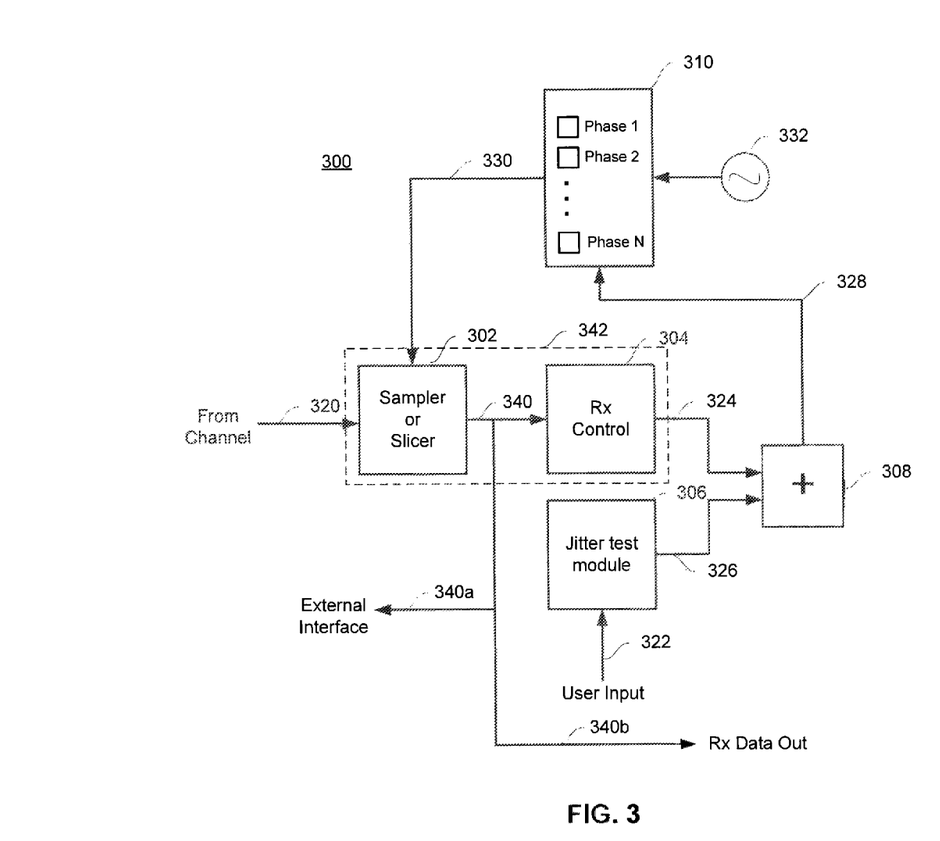
FIG. 3 is a block diagram of a receiver component of a communications system according to embodiments of the disclosure.

FIG. 3 is a block diagram depicting the operation of a receiver component 300 according to embodiments of the present disclosure. The receiver 300 includes a slicer 302, a timing recovery module 304, a jitter test module 306, a combiner 308, and a phase adjuster 310. As shown in FIG. 3, a channel input signal 320 is received initially at a sampler or slicer 302, which then produces a digital output signal 340. If the jitter has been introduced into the channel input signal by the transmitter 200, then the digital output signal 340 can be analyzed using external interface 340a to determine the system's tolerance to jitter by allowing examination of the receiver measurements performed on-chip. However, according to embodiments of the disclosure, it is also possible to introduce jitter at the receiver 300 to test jitter tolerance as will be described below. Additionally, the jitter tolerance measurements need not be performed outside of the receiver.

During normal communications mode, slicer 302 samples channel input signal 320 at a sampling time controlled by the sample control (or recovery) signal 330, where the slicer output 340 is typically a binary "1" or binary "0". A person of ordinary skill in the art would also understand that various embodiments may apply to multilevel modulation formats (e.g., PAM-3, PAM-4, etc.). Additionally, according to various embodiments, the function of slicer 302 could be performed by an analog-to-digital converter (ADC). The timing recovery module 304 examines the bit stream from the slicer output 340 and produces a timing recovery signal 324 to adjust the slicer sample time to occur at (or near) the center of the "eye diagram" of channel input signal 320. In the case of non-binary modulation, the slicer can be adjusted to sample at a point that corresponds to the substantially the best SNR, the best BER, or the maximum eye opening. Assuming jitter control signal 326 is inactive, the timing recovery signal 324 provides the control input to the phase adjuster 310, which adjusts the phase of the signal from clock 332 as required to improve the sampling time of the sample control signal 330.

Accordingly, the timing recovery signal 324 essentially acts as feedback to control the sample timing of the slicer 302. The slicer 302 operates by detecting the analog voltage of the channel input signal 302 at periodic intervals (the frequency defined by the clock 332), and determining whether the voltage level corresponds to a binary 1 or a binary 0. Ideally, the slicer 302 detects the signal at its max/min point (i.e., at high signal level for binary 1 or low signal level or binary 0, which is the center of the "eye diagram"). However, if there is distortion in the signal, noise, or phase shift, then the slicer 302 may end up detecting the signal at some other point than the max/min point of the signal, which can lead to bit errors. If this occurs, then the timing recovery module 304 detects this and produces the appropriate control signal 324 to cause the phase adjuster 310 to phase-shift the sample control signal 330 so that the slicer is "re-centered" closer to the max/min point of the channel input signal 320. In this way, during normal operation, the receiver circuit 300 can adjust for variations (e.g., noise or distortion) in the received signal 320.

During a test mode, the jitter test module 306 receives an input jitter control 322 from an external source (e.g. user input) that defines the type and severity of jitter that is to be introduced at the receiver. The jitter test module 306 then produces a jitter control signal 326 to stimulate the phase adjuster 310 to appropriately introduce jitter in the sampling control signal 330. The jitter control signal 326 and the timing recovery signal 324 are combined by summer module 308 to produce combined signal 328. Combined signal 328 is then used to control phase adjuster 310, which phase-shifts the signal from clock 332 to produce the sampling control signal 330 that controls the sampling of slicer 302. By adding jitter to the control input of the phase adjuster 310, jitter is introduced into the sampling control signal 330 that controls the sampling of slicer 302, which causes the slicer 302 to sample according to the jitter defined by the input jitter control 322. The jitter will manifest itself as instantaneous and/or incremental movement of the sampling phase over time.

Since the jitter is combined with the timing recovery signal 324, the jitter offsets (or rides on top of) the timing recovery signal 324, which has the effect of spoiling the "re-centering" of the sampling time of slicer 302. Stated another way, the combined signal 328 introduces jitter by causing the slicer 302 to be offset from the min/max point of channel input signal by a certain amount, relative to that determined by the timing recovery module 304.

As was the case with the transmitter 200, the phase adjuster 310 in the receiver 300 can be made to introduce different types and severity of jitter depending on the received input jitter control 322. For instance, the phase adjuster can introduce the following types of jitter: sinusoidal jitter, random jitter, deterministic jitter, or a frequency offset. Further, the intensity or severity of the jitter can be defined and varied, so as to incrementally determine the receiver jitter tolerance. Still further, one or more of these jitter types can be introduced simultaneously.

In yet another test mode, a pre-defined frequency offset (separate from jitter testing) can be introduced in the sampling control signal 330 by controlling the phase rotator 310 to rotate at a continuous rate. This enables testing the frequency offset tolerance of the receiver without the need for an external reference to create the offset. Further, a DC offset, common mode offset, and the like, can be introduced at the slicer to perform additional types of testing.

As shown in FIG. 3, the output signal 340 is split into two separate signals, 340a and 340b, so that an external interface (340a) can examine jitter tolerance, while the data signal is still outputted (340b) as normal. Accordingly, the jitter test can be performed without interfering with the operation of the receiver 300. This can facilitate a number of advantages. For instance, since the output is not interfered with, the circuit can remain installed as part of a larger system when jitter tolerance is being tested.

Additionally, like the transmitter 200, the receiver 300 can operate in both a test mode and a regular mode. During normal communications mode, the jitter control module 306 might not be required, and can be normally powered-off, and then selectively powered-on during jitter test mode. Further, the jitter testing can even be implemented in normal communications mode, where normal data is being sent by the transmitter as long as there is some observable metric (e.g. BER, or SNR).

Figure 4:
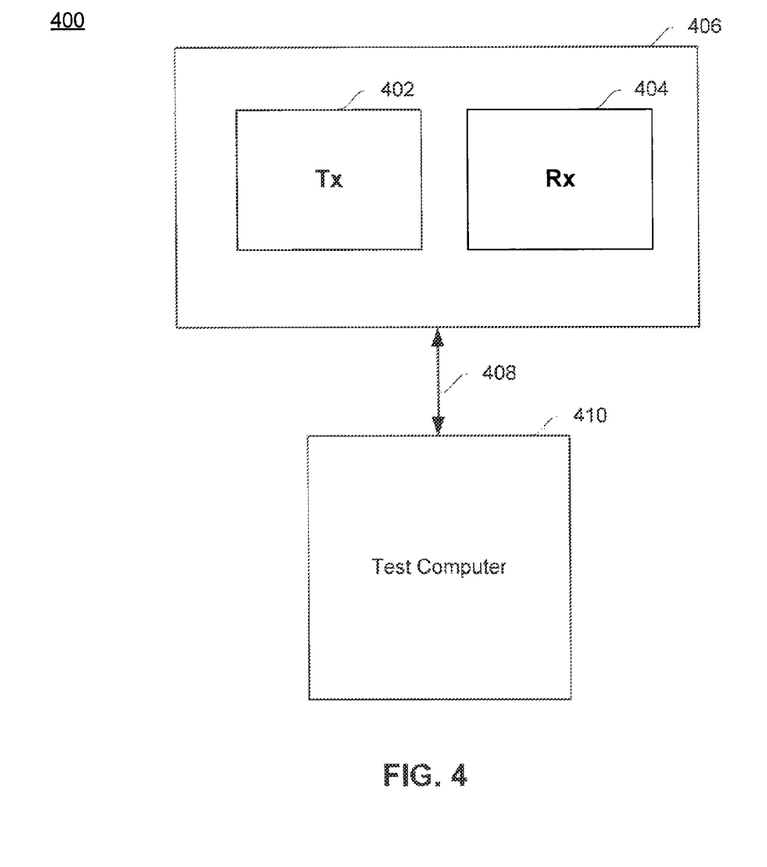
FIG. 4 is a block diagram depicting an exemplary communications system connected to a test computer according to embodiments of the disclosure.

FIG. 4 is a block diagram depicting a system 400 that can be used to test communication component 406 for its jitter tolerance according to embodiments of the present disclosure. As previously described, the communication component 406 can include a transmitter 402 and a receiver 404 that are representative of transmitter 200 and receiver 300 in FIGS. 2 and 3, described above. Additionally, a test computer 410 is connected to the communication component 406 via interface 408, where interface 408 is representative of transmit interface 216 and receiver interfaces 340 and 322 described above.

The test computer 410 can be connected to the communication component 406 either as part of: a production environment, a lab environment, or on-site after the communications component 406 has already been installed in another system, or other environments. When the communications component 406 is operating in test mode, the test computer 410 can introduce the jitter control signals (e.g. 216 or 322) via interface 408 that cause the jitter test modules of the transmitter 402, or the receiver 404, to generate various kinds of jitter (i.e., interfers) into the communications system, as described above for FIGS. 2 and 3. Advantageously, in embodiments of the disclosure, the jitter signal is generated by the transmitter 402 and/or the receiver 404 that is under test, and not by the test computer 410, as the test computer 410 is only providing a user interface for the user to input and define the jitter that is to be created. Therefore, multiple test computers can be inexpensively implemented in a production environment, since the actual jitter signal is generated "on-chip" using the adjusters available on the on-chip transmitters and receivers.

When in test mode, a channel can be created between the transmitter 402 and the receiver 404 of the communication component 406. The test computer 410 can introduce an appropriate input jitter control signal to the communication component 406 that causes the introduction of jitter into the system. According to some embodiments, the jitter is introduced in the transmitter 402 and according to other embodiments, the jitter is introduced by the receiver 404. According to some embodiments, however, the jitter can be introduced selectively at both the transmitter 402 and the receiver 404, depending on the particular tests a user wants to run on the communication component 406. Additionally, the test computer may perform a number of different tests on the communication component 406 depending on the particular test template being employed by the test computer. For instance, the test computer's test template could call for the testing of tolerance to some or all of the following types of jitter: sinusoidal jitter, random jitter, deterministic jitter, or frequency offset. Additionally, these may be tested simultaneously or sequentially according to various embodiments of the disclosure.

The test computer 410 can receive an output signal from the communication component 406 and use the output to assess the jitter tolerance of component 406 using a number of different metrics. For instance, the test computer 410 can calculate a bit error rate (BER) in the output signal or calculate a signal to noise ratio (SNR). Using the BER or SNR of the output signal, the test computer can determine whether the communication component 406 has an acceptable tolerance to jitter.

Figure 5:
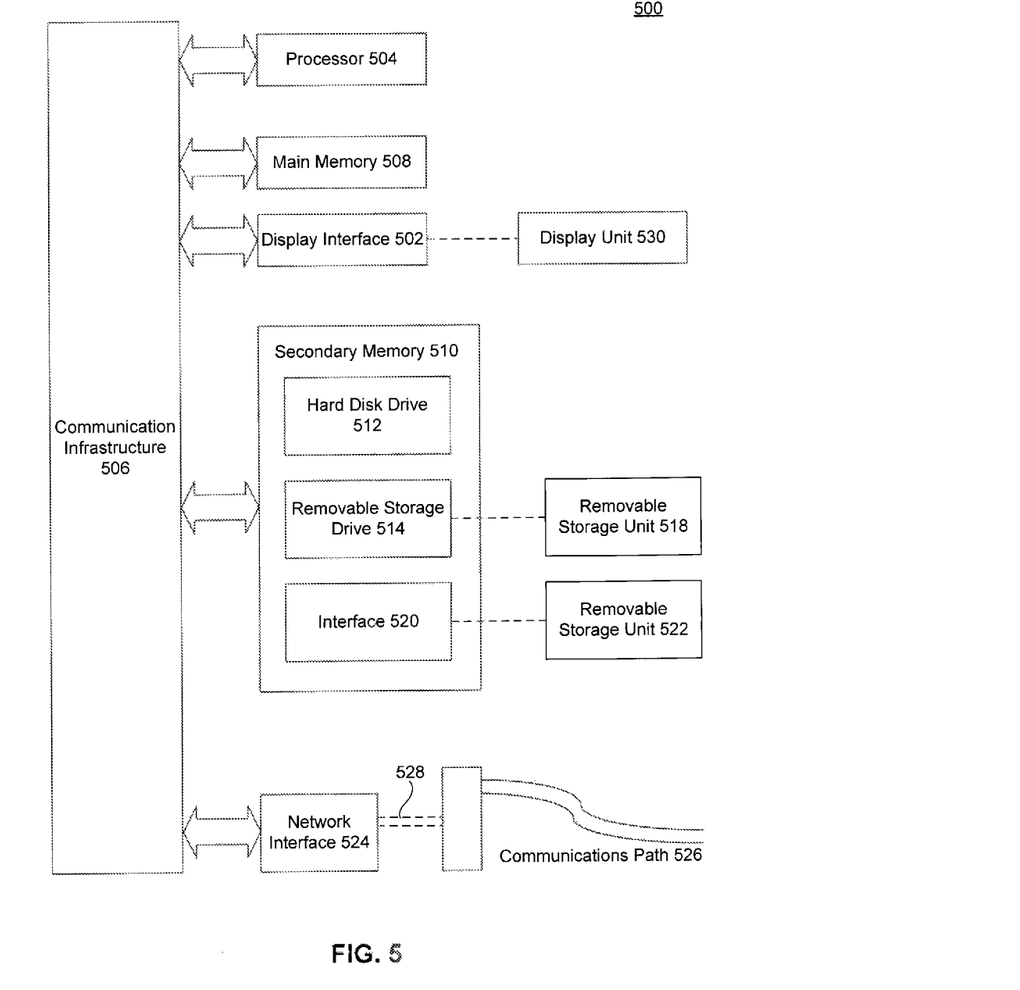
FIG. 5 is an exemplary computer system according to embodiments of the disclosure.

Various aspects of the present disclosure can be implemented by software, firmware, hardware, or a combination thereof. FIG. 5 illustrates an example computer system 500 in which the present disclosure, or portions thereof, can be implemented as computer-readable code. For example, test computer 410 can be implemented by test computer system 500. Various embodiments of the invention are described in terms of this example computer system 500. After reading this description, it will become apparent to a person skilled in the relevant art how to implement the invention using other computer systems and/or computer architectures.

Computer system 500 includes one or more processors, such as processor 504. Processor 504 can be a special purpose or a general purpose processor. Processor 504 is connected to a communication infrastructure 506 (for example, a bus or network).

Computer system 500 also includes a main memory 508, preferably random access memory (RAM), and may also include a secondary memory 510. Secondary memory 510 may include, for example, a hard disk drive 512, a removable storage drive 514, and/or a memory stick. Removable storage drive 514 may comprise a floppy disk drive, a magnetic tape drive, an optical disk drive, a flash memory, or the like. The removable storage drive 514 reads from and/or writes to a removable storage unit 518 in a well-known manner. Removable storage unit 518 may comprise a floppy disk, magnetic tape, optical disk, etc. that is read by and written to by removable storage drive 514. As will be appreciated by persons skilled in the relevant art(s), removable storage unit 518 includes a computer usable storage medium having stored therein computer software and/or data.

In alternative implementations, secondary memory 510 may include other similar means for allowing computer programs or other instructions to be loaded into computer system 500. Such means may include, for example, a removable storage unit 522 and an interface 1220. Examples of such means may include a program cartridge and cartridge interface (such as that found in video game devices), a removable memory chip (such as an EPROM, or PROM) and associated socket, and other removable storage units 522 and interfaces 520 that allow software and data to be transferred from the removable storage unit 522 to computer system 500.

Computer system 500 may also include a communications interface 524. Communications interface 524 allows software and data to be transferred between computer system 500 and external devices. Communications interface 524 may include a modem, a network interface (such as an Ethernet card), a communications port, a PCMCIA slot and card, or the like. Software and data transferred via communications interface 524 are in the form of signals that may be electronic, electromagnetic, optical, or other signals capable of being received by communications interface 524. These signals are provided to communications interface 524 via a communications path 526. Communications path 526 carries signals and may be implemented using wire or cable, fiber optics, a phone line, a cellular phone link, an RF link or other communications channels.

In this document, the terms "computer program medium" and "computer usable medium" are used to generally refer to media such as removable storage unit 518, removable storage unit 522, and a hard disk installed in hard disk drive 512. Signals carried over communications path 526 can also embody the logic described herein. Computer program medium and computer usable medium can also refer to memories, such as main memory 508 and secondary memory 510, which can be memory semiconductors (e.g. DRAMs, etc.). These computer program products are means for providing software to computer system 500.

Computer programs (also called computer control logic) are stored in main memory 508 and/or secondary memory 510. Computer programs may also be received via communications interface 524. Such computer programs, when executed, enable computer system 500 to implement the present invention as discussed herein. In particular, the computer programs, when executed, enable processor 504 to implement the processes of the present disclosure. Accordingly, such computer programs represent controllers of the computer system 500. Where the invention is implemented using software, the software may be stored in a computer program product and loaded into computer system 500 using removable storage drive 514, interface 520, hard drive 512 or communications interface 524.

The disclosure is also directed to computer program products comprising software stored on any computer useable medium. Such software, when executed in one or more data processing device, causes a data processing device(s) to operate as described herein. Embodiments of the invention employ any computer useable or readable medium, known now or in the future. Examples of computer useable mediums include, but are not limited to, primary storage devices (e.g., any type of random access memory), secondary storage devices (e.g., hard drives, floppy disks, CD ROMS, ZIP disks, tapes, magnetic storage devices, optical storage devices, MEMS, nanotechnological storage device, etc.), and communication mediums (e.g., wired and wireless communications networks, local area networks, wide area networks, intranets, etc.).

Figure 6:
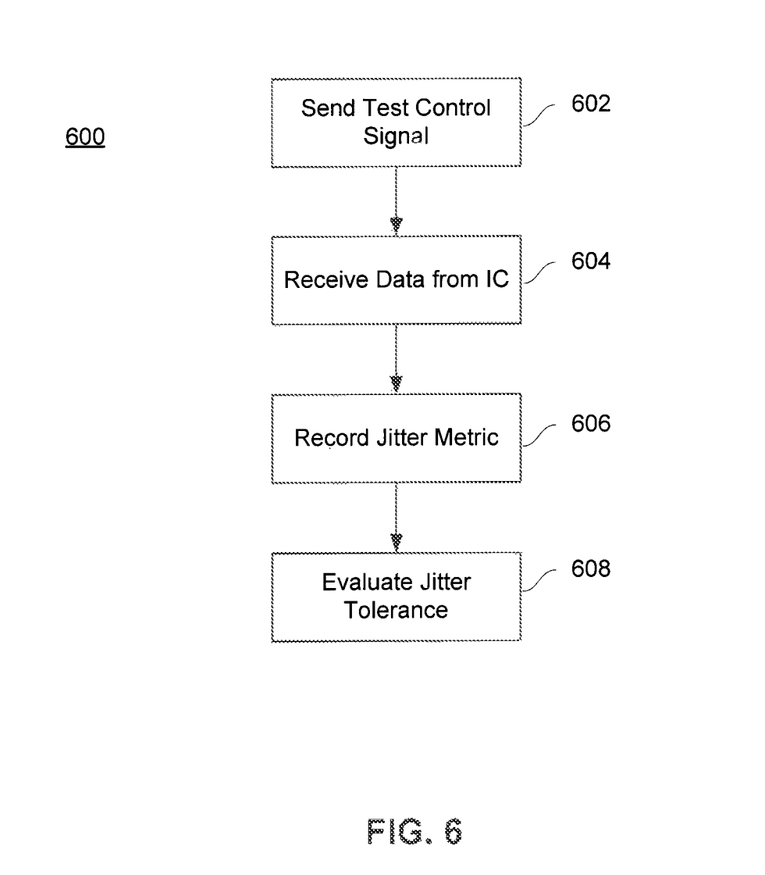
FIG. 6 is a flowchart depicting a method for testing jitter tolerance according to embodiments of the disclosure.

FIG. 6 depicts a method 600 for conducting a test of the jitter tolerance of a communication component 406 using a test computer 410 where the jitter is generated on-chip at the communication component 406 according to embodiments of the present disclosure. At step 602, the test computer can send an input jitter control signal to the communication component 406, which causes the communication component 406 to induce jitter in the system. The input jitter control signal may include information directing the communication component 406 to introduce the jitter using either the transmitter 402, the receiver 404, or both. Further, the test control signal may specify that one or more types of jitter be introduced into the communications component 406, and the severity as described above.

At step 604, the test computer 410 can receive the output data from the integrated circuit communication component 406. The data received from the communication component 406 can then be analyzed at step 606 and an appropriate metric determined. For instance the BER or SNR of the received data may be determined. At step 608, the jitter tolerance of the communication component 406 can be evaluated based on the computed metric. For instance, test computer 410 may determine whether the metric exceeds, or falls short, of a predetermined value and, if it does, determine that the communication component 406 is not sufficiently jitter tolerant.

Figure 7:
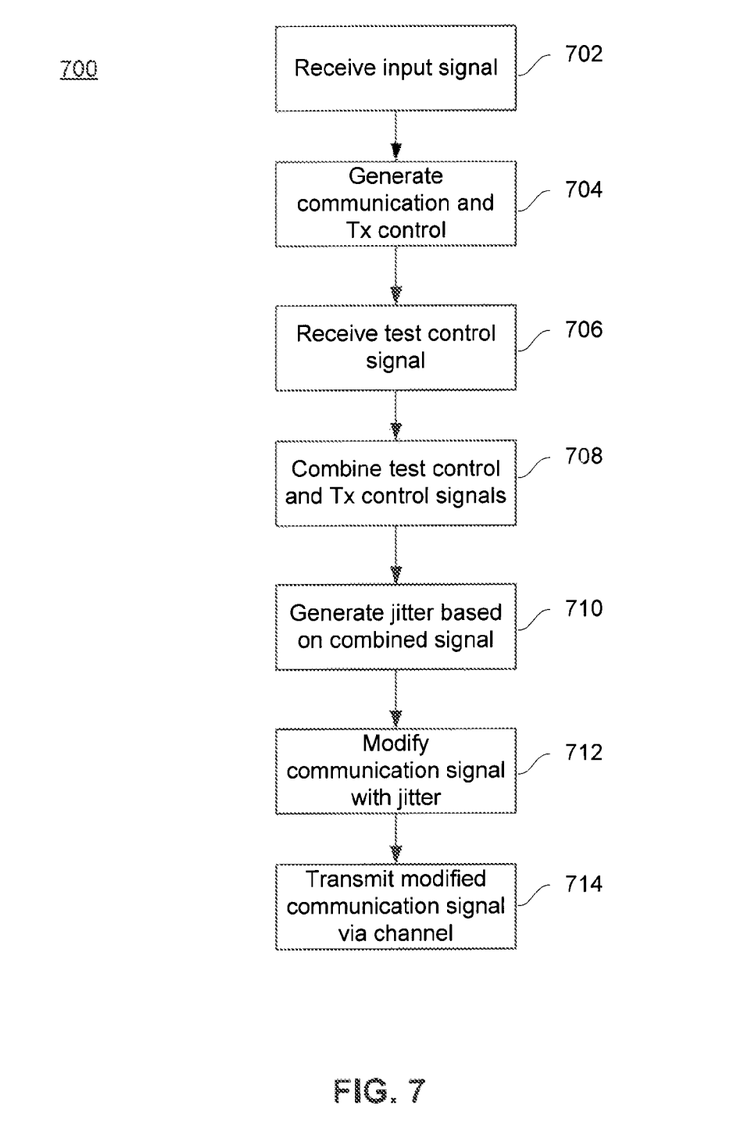
FIG. 7 is a flowchart depicting a method of introducing jitter into an integrated circuit according to embodiments of the disclosure.

As previously noted, the communication component 406 can introduce jitter at the transmitter according to embodiments of the disclosure. FIG. 7 is a flowchart depicting a method 700 of introducing jitter at the transmitter 402 according to embodiments of the disclosure. At step 702, the communication component 406 can receive an input signal and generate a communication signal at step 704. In an embodiment, the communications signal is a known test pattern signal that is generated in the transmitter 402, such as PRBS described above. At 706, an input jitter control signal is received from, for example, the test computer 410, that causes the generation of a jitter control signal. The input jitter control signal may specify the type and severity of jitter that is added to the communications signal. At 708, the jitter control signal is combined with a transmission control signal 710 at combiner 210. Jitter is then generated using a phase adjuster based on the combined signal at 710 and the communication signal is modified to include the jitter at 712. According to embodiments of the disclosure, the jitter is created using the phase adjuster 212 to modify the phase of the communications signal during transmission. The modified communication signal can then be transmitted via the channel at step 714.

Figure 8:
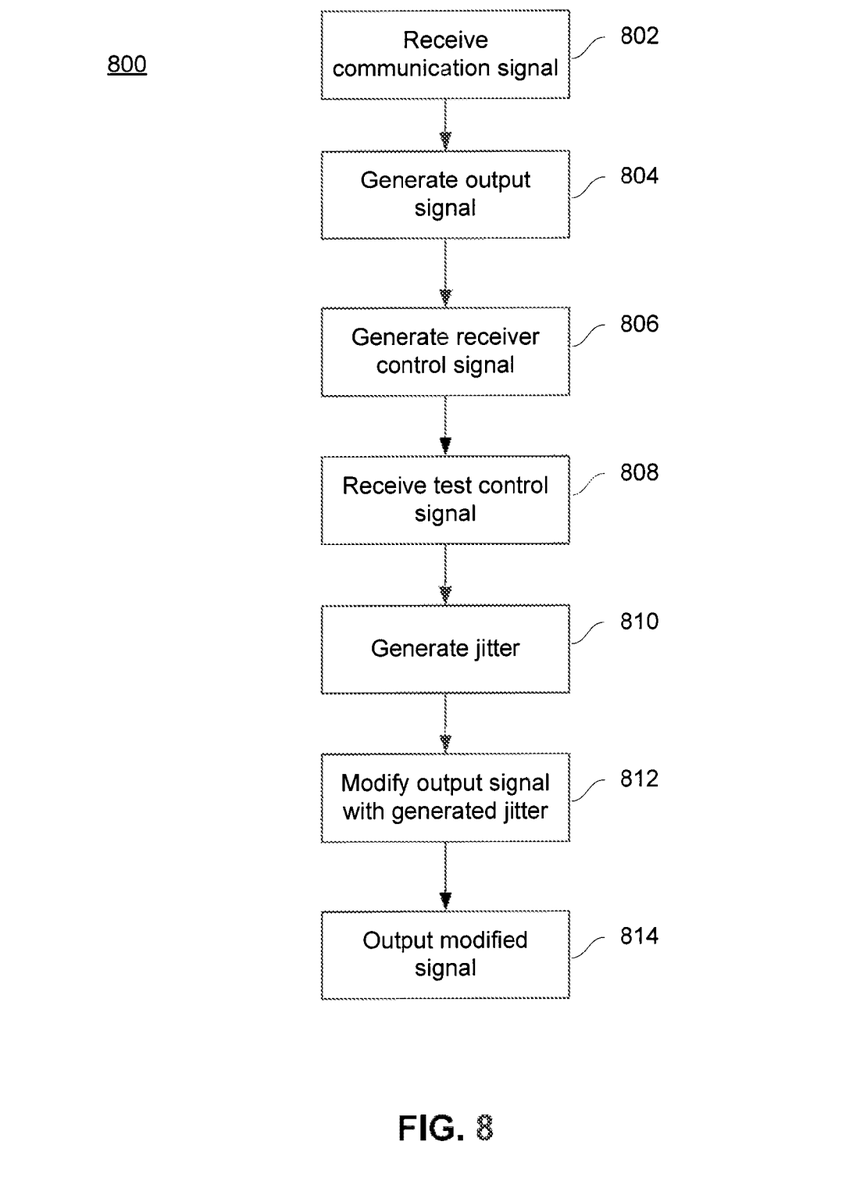
FIG. 8 is a flowchart depicting a method of introducing jitter into an integrated circuit according to embodiments of the disclosure.

FIG. 8 is a flowchart depicting a method 800 for introducing jitter at the receiver 404 according to embodiments of the present disclosure. As shown in FIG. 8, the receiver 404 can receive a communication signal at step 802. Based on the communication signal, the receiver can generate an appropriate output signal at step 804. At step 806, a timing recovery signal is created based on the generated output signal. At step 808, an input jitter control signal is received and a jitter control signal generated, where the input jitter control signal defines the type and severity of jitter that is to be added. At step 810, the jitter control signal can be combined with the timing recovery signal to form a combined signal. The combined signal can then be used to create a jitter signal at step 812. As noted above, the jitter signal can be created by controlling a phase adjuster 310 with the combined signal, where the phase adjuster controls the sampling of the communications signal. The output signal can then be modified with the jitter signal by controlling the sampling phase of the receiver's slicer or sampler at step 814.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed. For instance, the various embodiments of the invention could be performed independent of the channel, the line-code (or modulation scheme) and for a variety of wired or wireless chip-sets.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

CONCLUSION

It is to be appreciated that the Detailed Description and not the Abstract, is intended to be used to interpret the claims. The Abstract may set forth one or more, but not all exemplary embodiments of the disclosure, and thus, are not intended to limit the appended claims in any way.

The disclosure has been described above with the aid of functional building blocks illustrating the implementation of specified functions and relationships thereof. The boundaries of these functional building blocks have been arbitrarily defined herein for the convenience of the description. Alternate boundaries may be defined so long as the specified functions and relationships thereof are appropriately performed.

It will be apparent to those skilled in the relevant art(s) that various changes in form and detail can be made therein without departing from the spirit and scope of the invention. Thus the invention should not be limited by any of the above-described exemplary embodiments, but should be defined only in accordance with the following claims and their equivalents

What is claimed is:

1. An integrated circuit for communicating signals with predetermined jitter, comprising:
    an output queue having a signal input, a clock input and an output, wherein the output queue is configured to output a signal received at the signal input according to a clock signal received at the clock input;
    a phase adjuster configured to receive a phase adjustment input signal, and generate the clock signal by shifting the phase adjustment input signal according to a received phase control signal, and output the clock signal to the clock input of the output queue;
    a jitter test module configured to receive a jitter input signal and generate a jitter control signal based on the jitter input signal; and
    a combiner configured to produce the phase control signal by combining the jitter control signal with a transmit control signal.

2. The integrated circuit of claim 1, further comprising a processing module configured to generate a communication signal and output the communication signal to the signal input of the output queue.

3. The integrated circuit of claim 2, wherein the communication signal is generated from a received input communication signal.

4. The integrated circuit of claim 3, wherein the processing module further comprises a transmit control module configured to recover a clock signal associated with an input communication signal and output the transmit control signal based on the recovered clock signal.

5. The integrated circuit of claim 4, wherein the transmit control module is configured to only output the transmit control signal when the circuit is operating in a loop-back mode.

6. The integrated circuit of claim 4, wherein the received control signal for the phase adjuster is a combination of the transmit control signal and the jitter control signal.

7. The integrated circuit of claim 2, wherein the processing module further comprises a test signal generator configured to generate a test signal based on a received test clock signal.

8. The integrated circuit of claim 7, wherein the processing module outputs the test signal as the communication signal when the circuit is operating in a test mode.

9. The integrated circuit of claim 1, wherein the jitter input signal is received by a user controlled interface and defines a type and severity of jitter to be added to the output signal of the output queue.

10. The integrated circuit of claim 9, wherein the phase adjuster controls the phase of the output signal of the output queue according to the type and severity of jitter defined by the jitter input signal.

11. The integrated circuit of claim 1, wherein the phase adjuster is a phase interpolator.

12. A method of on-chip jitter tolerance testing in an integrated circuit for communications, the method comprising:
    receiving a jitter input signal at the integrated circuit;
    generating a jitter control signal based on the jitter input signal;
    combining the jitter control signal with a transmission control signal to create a combined signal;
    generating a test signal based on a received clock signal;
    generating a communications signal based on the test signal, wherein the communications signal is generated from the test signal by introducing jitter to the communications signal according to the combined signal; and
    transmitting the communications signal over a communications channel.

13. The method of claim 12, wherein the jitter input signal defines a type and severity of jitter added that is to be added to the test signal.

14. The method of claim 13, wherein the jitter is introduced by varying a phase of the test signal during transmission.

15. The method of claim 14, further comprising:
    receiving the communications signal via the communications channel and generating an output signal based on the received communications signal,
    analyzing the output signal to determine if the integrated circuit satisfies a jitter requirement.

16. The method of claim 15, wherein receiving the communications signal via the communications channel includes introducing additional jitter according to a second jitter control signal.

17. The method of claim 12, further comprising:
    generating a combined signal by combining the jitter control signal with a transmission control signal.

18. The method of claim 12, wherein generating the communications signal comprises generating the jitter based on the combined signal.

19. The method of claim 12, wherein the jitter is introduced to the communications signal by modifying a phase of the communications signal during transmission using a phase adjuster.

20. The method of claim 12, wherein transmitting the communications signal over a communications channel comprises outputting the communications signal to an output queue.

* * * * *

UNITED STATES PATENT AND TRADEMARK OFFICE
CERTIFICATE OF CORRECTION

| | | |
|---|---|---|
| PATENT NO. | : 9,025,693 B2 | Page 1 of 2 |
| APPLICATION NO. | : 13/538871 | |
| DATED | : May 5, 2015 | |
| INVENTOR(S) | : Wang et al. | |

It is certified that error appears in the above-identified patent and that said Letters Patent is hereby corrected as shown below:

Delete the title page showing number of claims and substitute the attached title page therefor.

In the Claims

Column 13, lines 48-49, replace "received control signal" with --received phase control signal--.

Column 14, lines 42-44, remove Claim 17 and renumber the remaining claims.

Signed and Sealed this
Twenty-ninth Day of September, 2015

Michelle K. Lee
*Director of the United States Patent and Trademark Office*

(12) United States Patent
Wang et al.

(10) Patent No.: US 9,025,693 B2
(45) Date of Patent: May 5, 2015

(54) ON-CHIP INTERFERERS FOR STANDARDS COMPLIANT JITTER TOLERANCE TESTING

(75) Inventors: John Wang, Sunnyvale, CA (US); Vasudevan Parthasarathy, Irvine, CA (US)

(73) Assignee: Broadcom Corporation, Irvine, CA (US)

(*) Notice: Subject to any disclaimer, the term of this patent is extended or adjusted under 35 U.S.C. 154(b) by 323 days.

(21) Appl. No.: 13/538,871

(22) Filed: Jun. 29, 2012

(65) Prior Publication Data
US 2013/0301691 A1 Nov. 14, 2013

Related U.S. Application Data

(60) Provisional application No. 61/646,527, filed on May 14, 2012.

(51) Int. Cl.
*H04B 17/00* (2006.01)

(52) U.S. Cl.
CPC ......... *H04B 17/14* (2013.01); *H04B 17/0012* (2013.01)

(58) Field of Classification Search
CPC .................................................. H04B 17/0012
USPC ................................ 375/285, 221, 226
See application file for complete search history.

(56) References Cited

U.S. PATENT DOCUMENTS

| | | | |
|---|---|---|---|
| 2005/0044463 A1* | 2/2005 | Frisch | 714/738 |
| 2007/0002989 A1* | 1/2007 | Song | 375/355 |
| 2010/0232558 A1* | 9/2010 | Terada et al. | 375/374 |

* cited by examiner

*Primary Examiner* — Michael Neff
(74) *Attorney, Agent, or Firm* — Sterne, Kessler, Goldstein & Fox P.L.L.C.

(57) ABSTRACT

Systems and methods that facilitate on-chip testing are provided. An integrated circuit can include a transmitter configured to transmit a communications signal via a communications channel. The integrated circuit can also include a receiver configured to receive the communications signal via the communications channel. A jitter creation module also can form part of the integrated circuit and can introduce jitter into the system thereby allowing for on-chip jitter testing. The jitter creation module can form either part of the transmitter or receiver and can introduce the jitter by phase interpolation.

19 Claims, 8 Drawing Sheets